(12) United States Patent
Peng et al.

(10) Patent No.: US 11,726,112 B2
(45) Date of Patent: Aug. 15, 2023

(54) ELECTROMAGNETIC SHIELDING DURING WAFER STAGE TESTING

(71) Applicant: Taiwan Semiconductor Manufacturing Co., Ltd., Hsinchu (TW)

(72) Inventors: Ching-Nen Peng, Hsinchu (TW); Hsien-Tang Wang, Hsinchu (TW); Mill-Jer Wang, Hsinchu (TW); Chi-Chang Lai, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 758 days.

(21) Appl. No.: 16/572,369

(22) Filed: Sep. 16, 2019

(65) Prior Publication Data
US 2021/0080487 A1    Mar. 18, 2021

(51) Int. Cl.
*G01R 1/18* (2006.01)
*G01R 31/28* (2006.01)
*H01L 21/66* (2006.01)
*H01L 23/552* (2006.01)

(52) U.S. Cl.
CPC ............ *G01R 1/18* (2013.01); *G01R 31/2887* (2013.01); *H01L 22/12* (2013.01); *H01L 23/552* (2013.01)

(58) Field of Classification Search
CPC ....... G01R 1/18; G01R 31/2887; H01L 22/12; H01L 23/552; H01L 28/40; H01L 2924/0002; H10B 20/20

USPC ... 324/600, 750.27, 76.11, 126, 500, 756.05, 324/538
See application file for complete search history.

(56) References Cited

U.S. PATENT DOCUMENTS

| 7,587,293 B2 | 9/2009 | Chang et al. | |
|---|---|---|---|
| 8,466,704 B1* | 6/2013 | Aflaki Beni | G01R 1/07342 324/755.11 |
| 2002/0075027 A1* | 6/2002 | Hollman | G01R 1/18 324/756.01 |
| 2011/0050267 A1* | 3/2011 | Pagani | G01R 1/18 324/756.03 |

OTHER PUBLICATIONS

RF Cafe, "Rectangular & Circular Waveguide: Equations, Fields, & $f_{co}$ Calculator", www.rfcafe.com/references/electrical/waveguide.htm retrieved on Aug. 13, 2019, 3 pages.

* cited by examiner

*Primary Examiner* — Lee E Rodak
*Assistant Examiner* — Trung Q Nguyen
(74) *Attorney, Agent, or Firm* — Seed IP Law Group

(57) ABSTRACT

A circuit probe includes a shielding probe having a base and a conductive probe ring on the base. A shielding cage is attached to the conductive probe ring and has an interior. The shielding cage is configured to be positioned to contain in the interior of the shielding cage at least one integrated circuit formed on a wafer, and to provide electromagnetic shielding of the at least one integrated circuit during testing of the at least one integrated circuit.

20 Claims, 16 Drawing Sheets

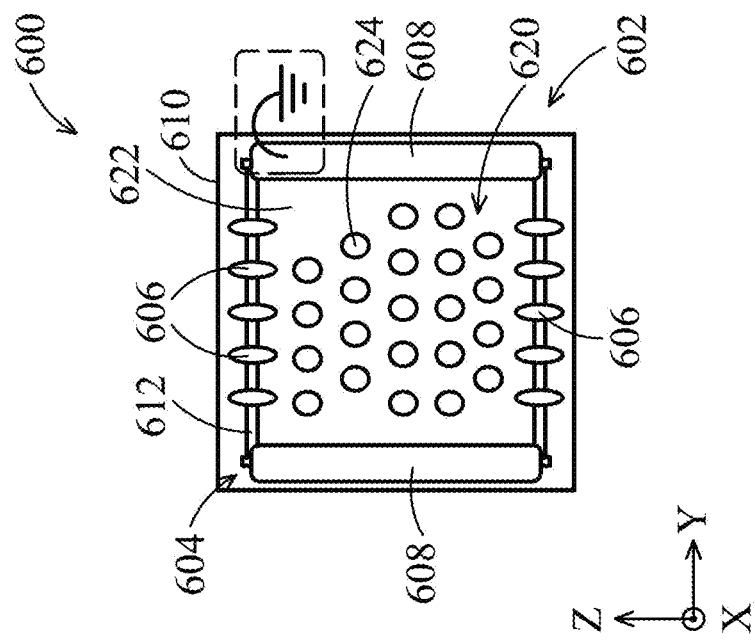
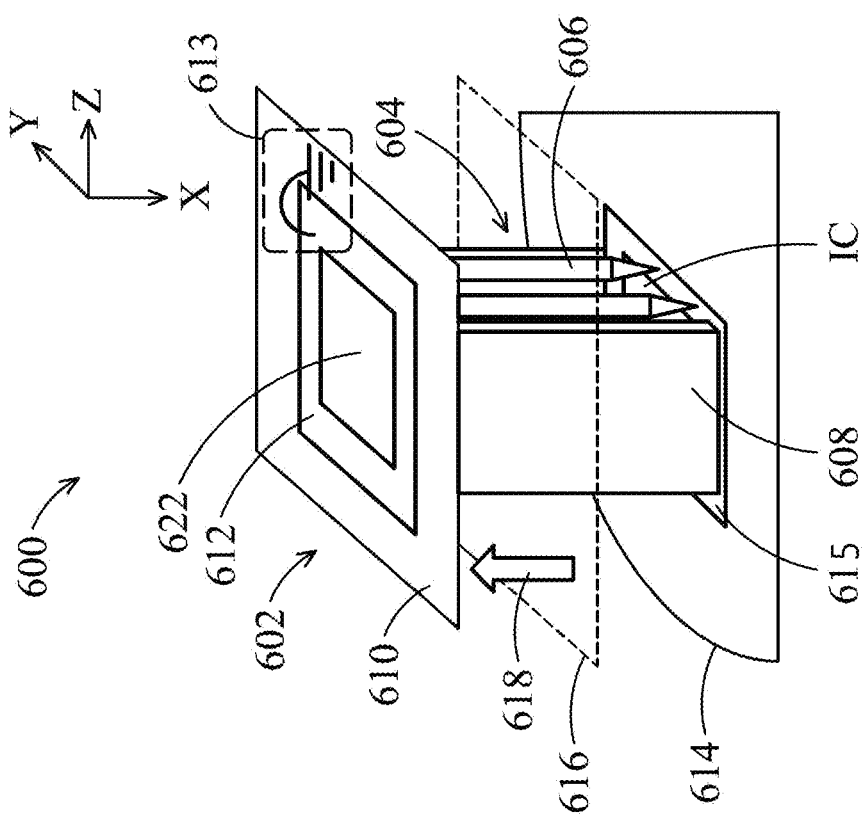
Figure 6A
Figure 6B

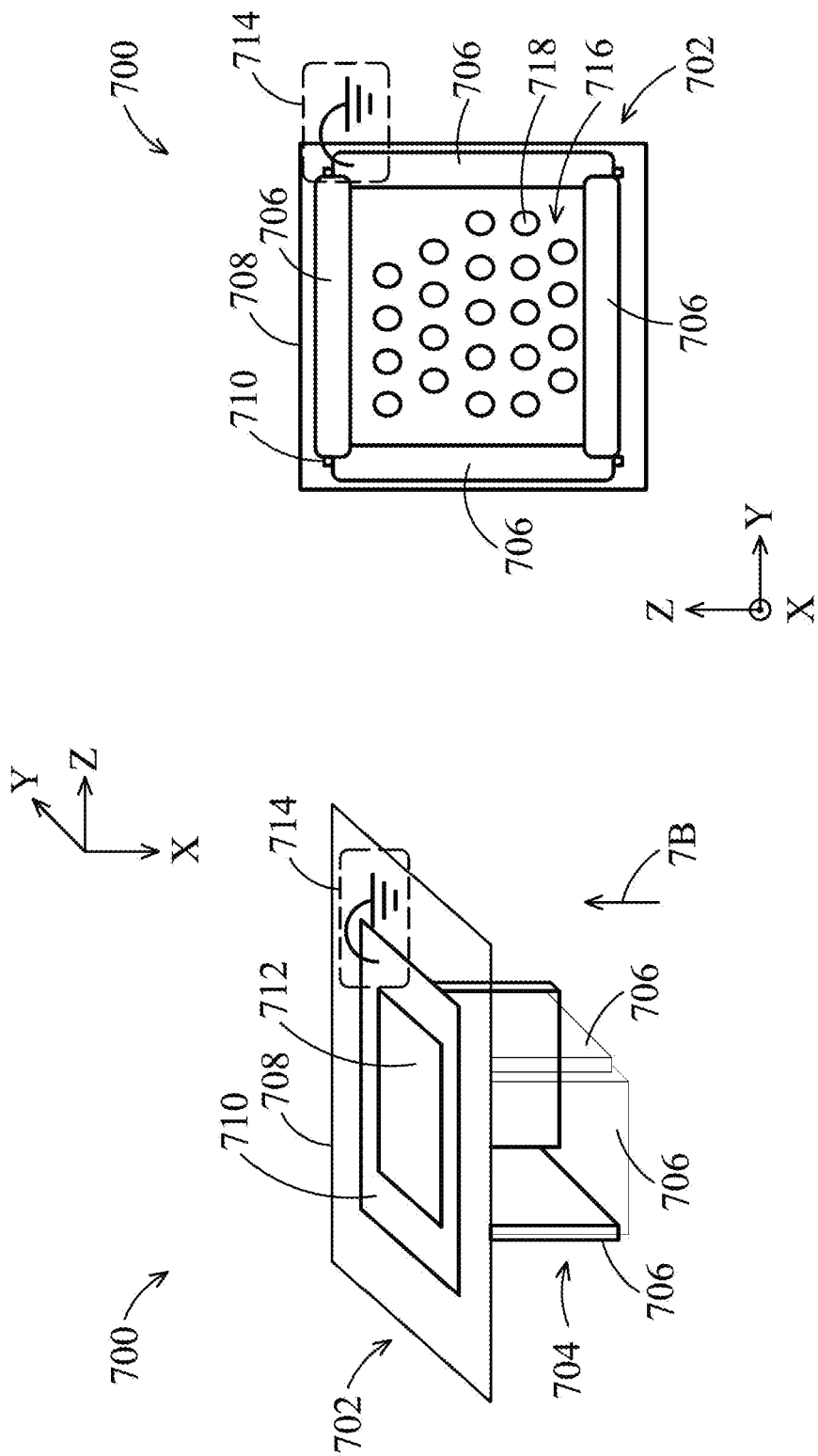

ELECTROMAGNETIC SHIELDING DURING WAFER STAGE TESTING

BACKGROUND

In the manufacture of semiconductor devices, a large number of integrated circuits are formed on a semiconductor wafer. These individual integrated circuits are then typically tested at a stage of the semiconductor manufacturing process known as "wafer stage testing," which occurs before the individual integrated circuits are singulated into individual chips or dies. During wafer stage testing, the individual integrated circuits are checked to detect faults, and the corresponding dies are marked defective and excluded from subsequent packaging operations performed on the dies.

Current advanced integrated circuits include components that require radio frequency (RF) testing on the integrated circuits be performed during wafer stage testing. This RF testing includes the extraction of RF parameters, such as S-parameters, for the modeling of the integrated circuit. The RF testing is performed during a circuit probe (CP) stage of the wafer stage testing in which a tester probe is sequentially positioned to electrically connect to each of the integrated circuits formed on the wafer. The tester probe then applies signals to and receives signals from each of the integrated circuits to thereby perform various tests on the integrated circuit. These tests would typically include DC trimming of components in the integrated circuit, programming of one-time programmable (OTP) elements, and RF testing as previously mentioned. When performing RF testing, electromagnetic waves not generated as part of the RF testing but which are present in the environment of the wafer and the integrated circuit being tested can interfere with the proper RF testing of the integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6A is a perspective view of a circuit probe including a shielding probe and FIG. 6B is a cross-sectional bottom view of this shielding probe in accordance with further embodiments of the present disclosure.

FIG. 7A is a perspective view of a circuit probe including a shielding probe having four conductive shield walls and FIG. 7B is a bottom view of this shielding probe in accordance with some embodiments.

DETAILED DESCRIPTION

Figure 1:
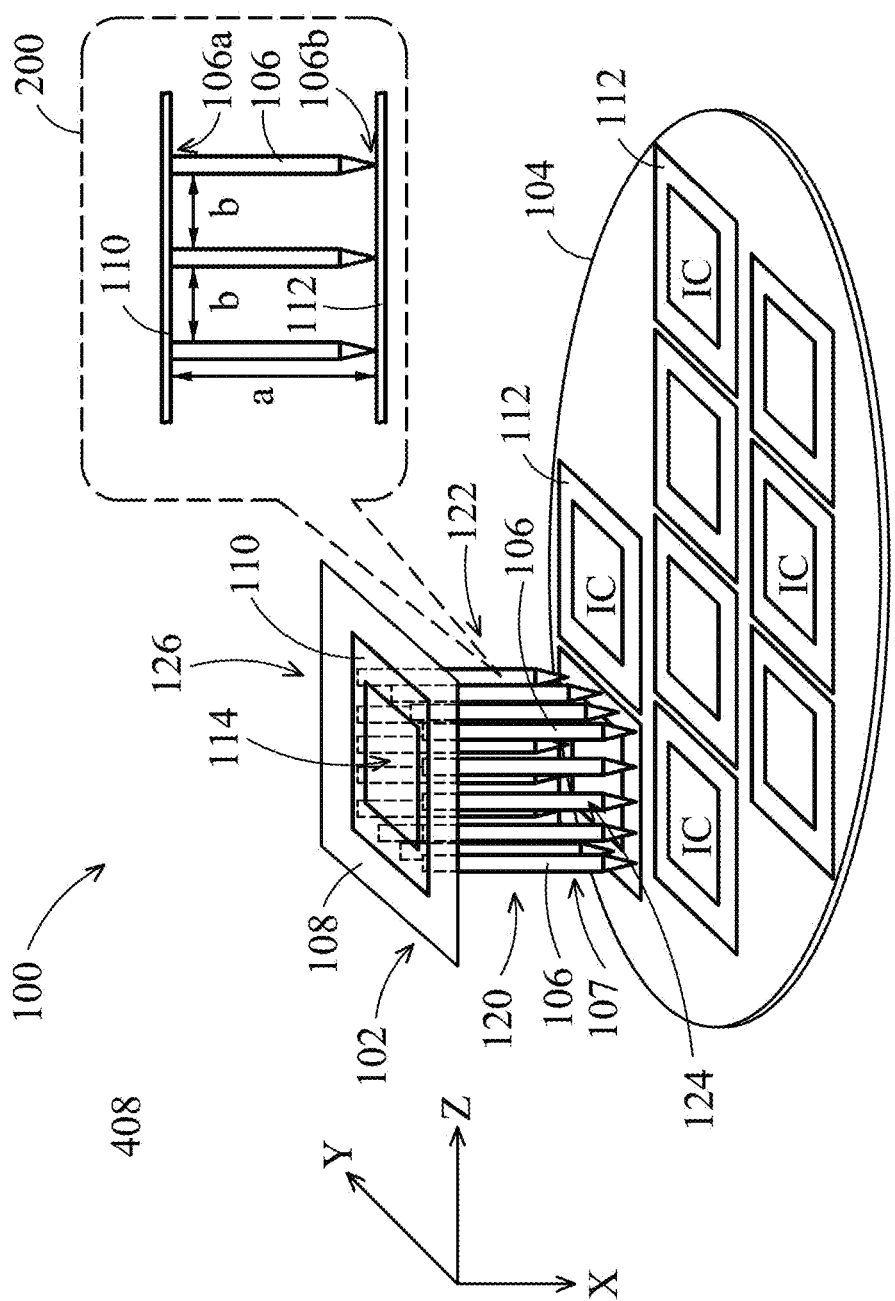
FIG. 1 is a perspective drawing of a circuit probe including a shielding probe in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a perspective drawing of a circuit probe 100 including a shielding probe 102 in accordance with some embodiments of the present disclosure. In the embodiment of FIG. 1, the circuit probe 100 includes the shielding probe 102 and a tester probe (not shown), with the shielding probe configured to surround the tester probe and an integrated circuit IC on a wafer 104 during testing of the integrated circuit by the tester probe, as will be described in more detail below. In the embodiment of FIG. 1, the shielding probe 102 includes a plurality of conductive shielding elements 106 spaced apart and arranged in a shape to form a shielding fence or cage 107 that provides the electromagnetic shielding of the integrated circuit IC in an interior of the fence or cage, as will be discussed in more detail below. The shielding probe 102 is also shown in a side view in the dashed line in the upper right portion of the figure. Each of the shielding elements 106 has a first end 106a attached to a base 108 of the shielding probe 102, and has a second end 106b opposite the first end that is configured to be positioned in contact with a conductive guard ring 112 on the wafer 104. More specifically, the base 108, which is a printed circuit board (PCB) or other suitable substrate in embodiments of the disclosure, includes a conductive probe ring 110, and the first ends 106a of the conductive shielding elements 106 are spaced apart and connected to the conductive probe ring. Where the base 108 is a PCB, the conductive probe ring 110 is a suitably formed conductive trace on the PCB, and may have shapes other than the rectangular or square type shape of FIG. 1. The wafer 104 includes a conductive guard ring 112 formed on the wafer around each of the integrated circuits IC in the embodiment of FIG. 1. This conductive guard ring 112 is a suitable conductive trace formed on the wafer surrounding each integrated circuit IC. The second ends 106b of the conductive shielding elements 106, which are pointed in the embodiment of FIG. 1, are configured to contact the guard ring 112 of a corresponding integrated circuit IC when that integrated circuit is being tested. As already mentioned, the tester probe is not shown in FIG. 1, but the tester probe would be positioned to extend into an interior 114 of the shielding probe 102, as will be described in more detail below.

As seen in the side view portion of FIG. 1, the conductive shielding elements 106 are spaced apart a height b along a first dimension of the shielding fence 107 formed by the elements, and have a width a along a second dimension of the fence. Thus, the first ends 106a of the conductive shielding elements 106 are connected, spaced apart the height b, to the conductive probe ring 110. The spacing of the elements 106 at the height b can be viewed as creating a small rectangular waveguide, with the height b and width a defining the wavelength and frequency of electromagnetic waves that can propagate in the waveguide. In this way, the value of the height b and width a are selected to shield electromagnetic waves of the desired frequency, as will now be explained in more detail below with reference to FIGS. 2 and 3A-3C. A Cartesian coordinate system having the axes X, Y and Z is defined for the shielding probe 102 in FIG. 1 and will be utilized in describing the shielding probe 102 in more detail below with reference to FIGS. 2 and 3A-3C. The term "height" is used to described the distance b and the term "width" the distance a due to the orientation of these distances when describing the waveguides formed by adjacent ones of the conductive shielding elements 106, as will appreciated in the discussion below for FIGS. 2 and 3A-3C.

Figure 2:
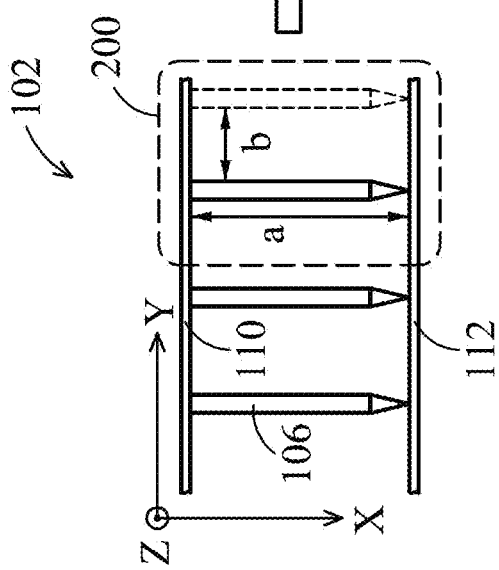
FIG. 2 is a side view of the shielding probe of FIG. 1 in accordance with some embodiments.

FIG. 2 is a side view of the shielding probe 102 of FIG. 1 and again shows the height b between conductive shielding elements 106 and the widths a of these elements. The Cartesian coordinate system having the axes X, Y and Z is again defined for the shielding probe 102 in FIG. 2 and will be used to explain in more detail the structure and theory of operation of the shielding probe. The height b between conductive shielding elements 106 extends in a direction parallel to the Y axis, while the widths a of the conductive shielding elements extend parallel to the X axis. The Z axis is out of the page in FIG. 2. The operation of an adjacent pair of conductive elements 106 in forming a waveguide 200 will now be described in more detail. Each adjacent pair of conductive elements 106 forms such a waveguide 200 and operates as will now be described with reference to FIGS. 3A-3C.

Figure 3A:
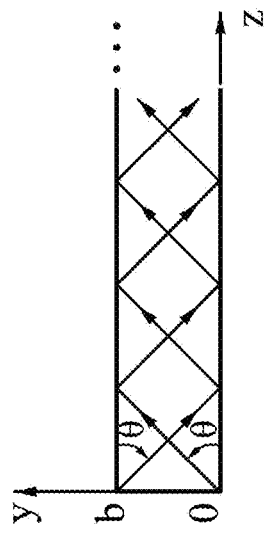
FIGS. 3A-3C illustrate the shielding operation of the shielding probe of FIGS. 1 and 2 in accordance with some embodiments.
Figure 3B:
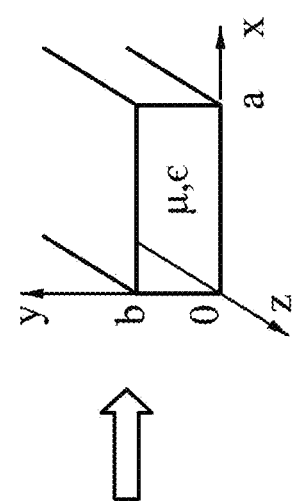
Figure 3C:
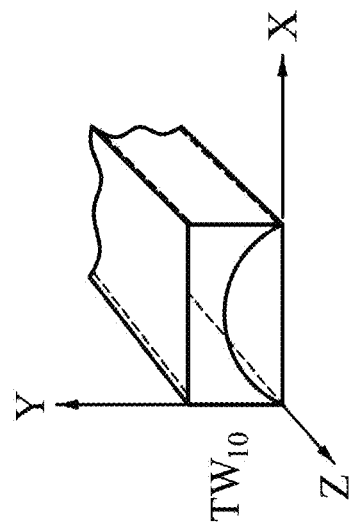

FIGS. 3A-3C illustrate the shielding operation and theory of operation of the waveguides 200 of the shielding probe 102. Adjacent pairs of conductive elements 106, in combination with the corresponding portions of the conductive probe ring 110 and conductive guard ring 112 extending between these two conductive elements, effectively form a rectangular waveguide 200 for the propagation of electromagnetic waves in a direction parallel to the Z axis. FIG. 3A is a perspective view representing the rectangular waveguide 200 and showing the X, Y and Z axes for this waveguide. As seen in the FIG. 3A, propagation of waves along or parallel to the Z-axis is propagation into or out of the page in this figure. Referring back to FIG. 1, this propagation of electromagnetic waves parallel to the Z-axis corresponds to the propagation of waves external to the shielding probe 102 to the interior 114 of the shielding probe, where such waves could interfere with the proper testing of the corresponding integrated circuit IC.

Each waveguide 200 has a magnetic permeability μ and electric permittivity ϵ, where the permeability and permittivity are the respective values in air. As will be appreciated by those skilled in the art, waveguide 200 acts as a high-pass filter. The transverse dimensions of the waveguide 200, are the width a of the conductive elements 106 and the height b between adjacent conductive elements. The greater of the two transverse dimensions, width a and height b, dominates a cutoff frequency fc of the waveguide. This cutoff frequency fc is independent of a length of the waveguide 200 along the Z-axis. In the rectangular waveguide 200, transverse electric TE and transverse magnetic TM waves may propagate through the waveguide. For transverse electric TE waves, the waveguide 200 has modes of operation, which are typically designated $TE_{mn}$ where m is an integer associated with the X-axis dimension of the waveguide 200, which is the width a, and n is an integer associated with the Y-axis dimension of the waveguide, which is the height b.

In the rectangular waveguide 200, the $TE_{10}$ mode is the dominant mode of operation (m=1, n=0) and the cutoff frequency fc in this situation, for which the width a is greater than the height b, is fc=(c/2a) where c is the velocity of electromagnetic waves in free space, which is approximately $3\times10^8$ meters/second. The cutoff wavelength is λc=2a/c in this mode. The $TE_{10}$ mode is illustrated in FIG. 3C and shows that the integer m denotes the number of half-cycle variations of the electromagnetic wave in along the X-axis, which is one in the $TE_{10}$ mode. In the waveguide 200, for electromagnetic waves having a frequency f greater than the cutoff frequency fc (f>fc and λ<λc), these electromagnetic waves enter the waveguide and experience internal reflection by the conductive elements of waveguide 200 and propagate through the waveguide in the Z-axis direction as illustrated in FIG. 3B. For electromagnetic waves having frequencies f less than the cutoff frequency fc (f<fc and λ>λc), however, the electromagnetic waves do not enter and do not propagate through the waveguide, but are reflected away from the waveguide entrance by the conductive elements of waveguide 200. In this way, the waveguide 200 effectively operates as a filter or shield for electromagnetic waves having frequencies f less than the cutoff frequency fc. For a situation in which the height b is greater than the width a, the cutoff frequency of waveguide 200 is fc=(c/2b).

Thus, by selecting the width a and height b associated with the conductive elements 106 of the shielding probe 102, the respective waveguides 200, including these elements, effectively block or shield electromagnetic waves of particular frequencies that are external to the shielding probe and propagating parallel to the Z-axis from entering the interior 114 of the shielding probe. The shielding probe 102 thereby effectively "shields" the integrated circuit IC in the interior 114 of the probe from being affected by these external electromagnetic waves.

In the present description, the phrases "in the interior" or "contained in the interior" are used to describe the position of the integrated circuit IC when the integrated circuit is being shielded by the shielding probe 102, as shown in FIG. 1. The shielding cage 107, base 108 and surface of the wafer 104, including the integrated circuit IC, define the interior 114 of the shielding probe in the embodiment of FIG. 1. The interior 114 corresponds to the three-dimensional space or region surrounded by these components, namely the region surrounded by the conductive elements 106 of the shielding cage 107 and bounded at the top of this region by the base 108 and at the bottom by the integrated circuit IC and surface of the wafer 104 surrounding the integrated circuit, including the conductive guard ring 112. Thus, when the shielding probe 102 is in position over the integrated circuit IC to be tested, this integrated circuit is said to be "in the interior" or "contained in the interior" 114 of the shielding probe.

Also note that in some embodiments of shielding probes according to the present disclosure as described below, the wafer includes no conductive guard rings or the shielding probe does not contact the surface of the wafer when the integrated circuit IC is being tested. Once again, even in these situations, the integrated circuit IC to be tested will be described as being contained in the interior of the shielding probe when the probe is in position over the integrated circuit IC to be tested, whether the probe is in contact with the surface of the wafer or not. The volume or region defining the interior of the shielding probe would, in these cases, effectively include the region defined by the shielding cage extended or projected down to the surface of the wafer surrounding the integrated circuit being tested. Finally, in further embodiments of shielding probes according to the present disclosure that will be described below, the shielding probe is configured to shield multiple integrated circuits IC. Once again, in such embodiments, these multiple integrated circuits IC will be described as being in or contained in the interior of the shielding probe when the probe is in position over the multiple integrated circuits, whether the probe is in contact with the surface of the wafer or not.

Table 1 set forth below shows example frequencies f of electromagnetic waves and the corresponding wavelength λ for each frequency, as well as the ½λ value.

TABLE 1

| Frequency (GHz) | Wavelength (mm) | ½ Wavelength (mm) |
|---|---|---|
| 2 | 150.0 | 75 |
| 5 | 60.0 | 30 |
| 10 | 30.0 | 15 |
| 20 | 15 | 7.5 |
| 30 | 10 | 5 |
| 40 | 7.5 | 3.75 |
| 60 | 5 | 2.5 |

The ½ λ values in Table 1 correspond to the width a for the waveguides 200 for the $TE_{10}$ mode of operation. Thus, by selecting the dimensions of the shielding probe 102, namely the width a of the conductive elements 106 and height b defining the spacing between adjacent conductive elements, the shielding probe provides shielding of electromagnetic waves having frequencies f less than the cutoff frequency fc of the waveguides 200.

Referring back to FIGS. 1, 2 and 3A-3C, the waveguide 200 described therein corresponds to one of the waveguides formed by an adjacent pair of the conductive elements 106 and corresponding portions of the conductive probe ring 110 and conductive guard ring 112 on a left side 120 and a right side 122 of the shielding probe 102 in FIG. 1. Thus, these waveguides 200 shield the integrated circuit IC being tested from external electromagnetic waves propagating parallel to the Z-axis. The shielding probe 102 also includes the conductive elements 106 and corresponding portions of the conductive probe ring 110 and conductive guard ring 112 at a front side 124 and a rear side 126 of the shielding probe in FIG. 1. The waveguides 200 including the front side 124 and the rear side 126 conductive elements 106 of the shielding probe 102 shield the integrated circuit IC being tested from external electromagnetic waves propagating parallel to the Y-axis as seen in FIG. 1. In addition, the waveguide 200 described therein, is similar to a waveguide formed by the conductive probe ring 110, the conductive elements 106 and the conductive guard ring 112. A longest side dimension of the conductive probe ring 110 determines the cutoff frequency fc for electromagnetic waves propagating parallel to the X-axis. Because the longest side dimension of the conductive probe ring 110 may be different than the greater of width a and height b, the cutoff frequency fc for electromagnetic waves propagating parallel to the X-axis may be different than the cutoff frequency fc for electromagnetic waves propagating parallel to the Z-axis and the Y-axis. A continuous area of the wafer 104 coupled to the conductive guard ring 112 may raise the cutoff frequency fc for electromagnetic waves traveling parallel to the X-axis, but an attenuation of electromagnetic waves propagating parallel to the X-axis by wafer 104 may be limited by a resistivity of the wafer 104. The shielding probe 102 accordingly shields the integrated circuit IC being tested (i.e., on the interior 114 of the shielding probe) from electromagnetic waves propagating in all directions and having frequencies less than the cutoff frequency fc.

Figure 4A:
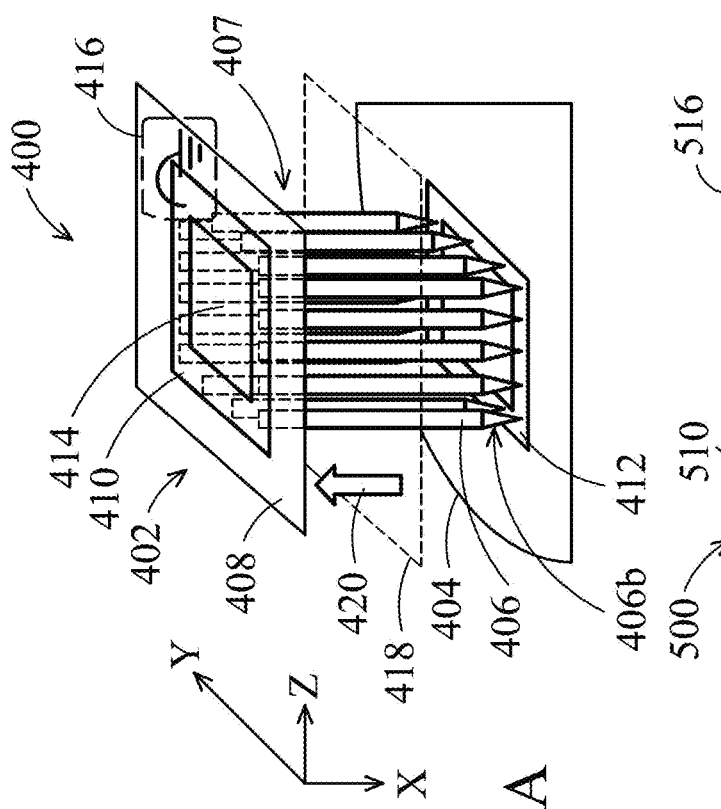
FIG. 4A is a perspective view of a circuit probe including a shielding probe and FIG. 4B is a cross-sectional view of this circuit probe showing circular-shaped conductive elements of the shielding probe in accordance with some embodiments.
Figure 4B:
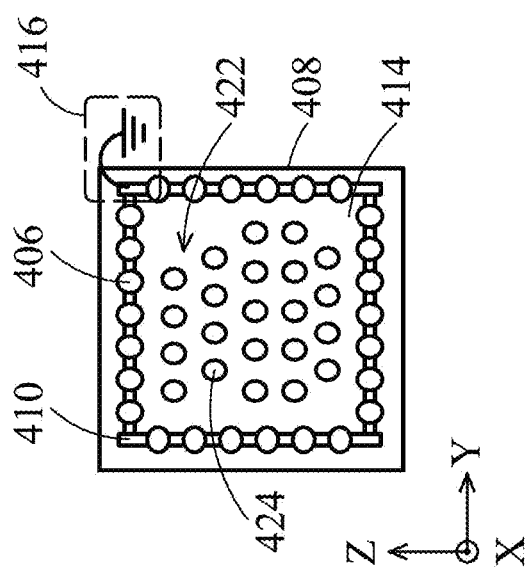

FIG. 4A is a perspective view of a shielding probe 402 and FIG. 4B is a bottom view of this shielding probe 402 in accordance with some embodiments of the present disclosure. The components 404-414 of the shielding probe are the same as or similar to the components 104-114 in the embodiment of FIG. 1 and accordingly will not again be described in detail with reference to FIGS. 4A and 4B. In the embodiment of FIG. 4A, the conductive probe ring 410 on the base 408 is connected to a ground voltage reference node receiving a ground reference voltage, as indicated through the ground symbol in the dashed line 416. This will ground (i.e., connect to the ground voltage reference node) all the components of the shielding probe 402, namely the conductive probe ring 410, conductive elements 406, and conductive guard ring 412.

In FIG. 4A, a plane 418 shows the point of a cross-sectional bottom view in the direction as indicated by arrow 420 and illustrates the point of the cross-sectional view of FIG. 4B. FIG. 4B shows the cross-sections of the conductive elements 406 are circular such that each conductive element is a cylinder-shaped rod having pointed second ends 406b for contacting the conductive guard ring 412 on the wafer 404. FIG. 4B also shows a tester probe 422 that is contained on the circuit probe 400 in the interior 414 of the shielding probe 402. The tester probe 422 is omitted in the view of FIG. 4A to simplify this figure. The tester probe 422 includes a plurality of test contacts 424, which are represented as circles in the cross-sectional view of FIG. 4B. These test contacts 424 are configured to contact conductive pads or bumps of the integrated circuit IC (FIG. 1) being tested. The test contacts 424 are conductive and in this way testing circuitry (not shown) coupled to these test contacts provides electrical test signals to and receives electrical test signals from the integrated circuit IC to thereby test the integrated circuit. As described above with reference to FIGS. 1, 2 and 3A-3B, the shielding probe 402 shields or provides isolation of the interior 414 of the shielding probe from electromagnetic waves external to the circuit probe 400. The test contacts 424 of the tester probe 422 are located on the interior 414 of the shielding probe 402 and in this way the shielding probe shields or provides electrical isolation of these test contacts to allow for proper testing of the integrated circuit IC being tested. Referring back to FIG. 1, the circuit probe 400 is the same as the circuit probe 100 of FIG. 1 except that the conductive probe ring 410 is grounded in the circuit probe 400 and the conductive probe ring 110 is not grounded in the circuit probe 100.

Figure 5:
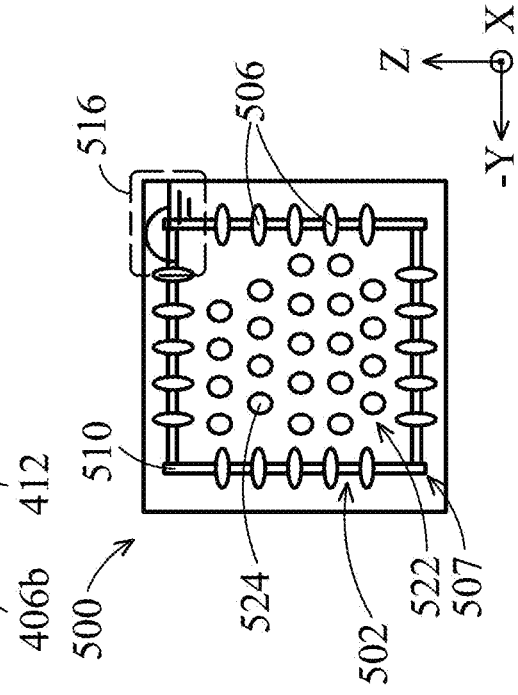
FIG. 5 is a cross-sectional view of a circuit probe including a shielding probe in which conductive elements have non-circular cross-sections in accordance with some embodiments.

FIG. 5 is another cross-sectional view of a circuit probe 500 in which conductive elements 506 of the shielding probe have a non-circular cross-section in accordance with some embodiments. The structure of the circuit probe 500 is the same as the circuit probe 100 or 400 of FIGS. 1, 4A and 4B, except for the cross-sectional shape of the conductive elements 506. More specifically, the conductive elements 506 have an oval-shaped cross-section in the embodiment of FIG. 5. In still other embodiments, the conductive elements have different cross-sectional shapes, and the conductive elements of shielding probes of the present disclosure are not limited to the circular cross-sections of FIGS. 1 and 4 or the oval cross-section of FIG. 5.

FIG. 6A is a perspective view of a circuit probe 600 including a shielding probe 602 and FIG. 6B a cross-sectional bottom view of this shielding probe in accordance with further embodiments of the present disclosure. The shielding probe 602 is similar to the shielding probes 102, 402 and 502 previously described, except in the shielding probe 602, a shielding cage 604 is formed by conductive elements 606 on two sides of the cage and is formed by conductive shield sheets or walls 608 on the other two sides of the cage. Instead of having conductive elements on all four sides of the shielding cage, as for the shielding cages 107 and 407 (FIGS. 1 and 4), the shielding cage 604 includes the conductive shield walls 608 forming two sides of this conductive cage. Each conductive shield wall 608 has a first side attached to one side of the conductive probe ring 612 and a second side opposite the first side. The shielding probe 602 includes a base 610, and a conductive probe ring 612 on the base to which one end of each of the conductive elements 606 and one end of each of the conductive shield walls 608 are attached. The conductive probe ring 612 is grounded, as represented in the dashed box 613. In this embodiment, a wafer 614 includes integrated circuits IC formed in the wafer (one of which is shown in FIG. 6A), each integrated circuit including a conductive guard ring 615 on the wafer surrounding a corresponding integrated circuit.

A plane indicated by dashed line 616 viewed along the direction of arrow 618 shows the cross-sectional view of FIG. 6B of the circuit probe 600. The circuit probe 600 includes the shielding probe 602 and a tester probe 620 on an interior 622 of the shielding probe. The tester probe 620 is not shown in FIG. 6A to simplify this figure. The tester probe 620 includes test contacts 624, and operates as described above for the tester probe 422 and test contacts 424 in relation to FIG. 4B to test the integrated circuit IC on the interior 622 of the shielding probe 602. As seen in FIG. 6B, each of the conductive elements 606 on the top and bottom sides of the shielding cage 604 has a non-circular cross-section shape. The cross-sections of the conductive elements 606 are oval-shaped in the embodiment of FIG. 6B and are the same as or similar to the conductive elements 506 of FIG. 5. Also note that in FIG. 6A the conductive elements 606 are shown as having circular cross-sections merely to simplify this figure, and these conductive elements have oval-shaped cross sections, as clearly shown in FIG. 6B.

In operation of the shielding probe 602, the pairs of conductive elements 606 at the top and bottom of the shielding cage 604 operate as waveguides, as previously described for the shielding cages 107, 407, and 507 in FIGS. 1, 4A, 4B and 5. Thus, the waveguides formed by the conductive elements 606 and corresponding portions of the probe ring 612 and guard ring 615 shield or isolate the tester probe 620 on the interior 622 of the shielding probe 602 from electromagnetic waves propagating parallel to the Z-axis. The second sides of the conductive shield walls 608 of the shielding probe 602 contact the conductive guard ring 615 and function to shield the tester probe 620 from electromagnetic waves propagating parallel to the Y-axis. Instead of functioning as waveguides, however, the conductive shield walls 608 shield the interior 622 of the shielding probe 602 through the skin depth or skin effect of a conductive sheet, as will be appreciated by those skilled in the art. The skin depth of the conductive shield walls 608 results in significant attenuation of electromagnetic waves external to the shielding probe 602 and propagating parallel to the Y-axis. The shielding probe 602 thereby utilizes two shielding methods to shield the tester probe 620 and integrated circuit IC on the interior 622 of the shielding probe 602 from external electromagnetic waves. More specifically, the shielding probe 602 provides shielding through the waveguides formed by the conductive elements 606 along the top and bottom sides of the shielding cage 604 and through the conductive shield walls 608 forming the left and right sides of the shielding cage as shown in FIG. 6B.

FIG. 7A is a perspective view of a circuit probe 700 including a shielding probe 702 having a shielding cage 704 including four conductive shield walls 706 and FIG. 7B is a bottom view of this circuit probe in accordance with further embodiments of the present disclosure. The shielding probe 702 is similar to the shielding probes 102, 402, 502 and 602 previously described, except in the shielding probe 702 the shielding cage 704 is formed by the four conductive shield walls 706 on the four sides of the cage and does not include conductive elements as part of the shielding cage as in the prior embodiments. The shielding probe 702 further includes a base 708 and conductive probe ring 710 on the base to which one end of each of the conductive shield walls 706 is attached. An interior 712 of the shielding probe 702 is inside the four conductive shielding walls 706. The conductive probe ring 710 is grounded, as represented in the dashed box 714. FIG. 7B shows a tester probe 716 including a plurality of test contacts 718 on the interior 712 of the shielding probe 702. In operation of the shielding probe 702, each of the conductive shield walls 706 functions to shield the tester probe 716 on the interior 712 of the shielding probe from electromagnetic waves propagating parallel to the Z- and Y-axes. As described for the conductive shield walls 608 of FIGS. 6A, 6B, instead of functioning as waveguides, the conductive shield walls 706 shield the interior 712 of the shielding probe 702 through the skin depth or skin effect of a conductive sheet, as will be appreciated by those skilled in the art.

Figure 8:
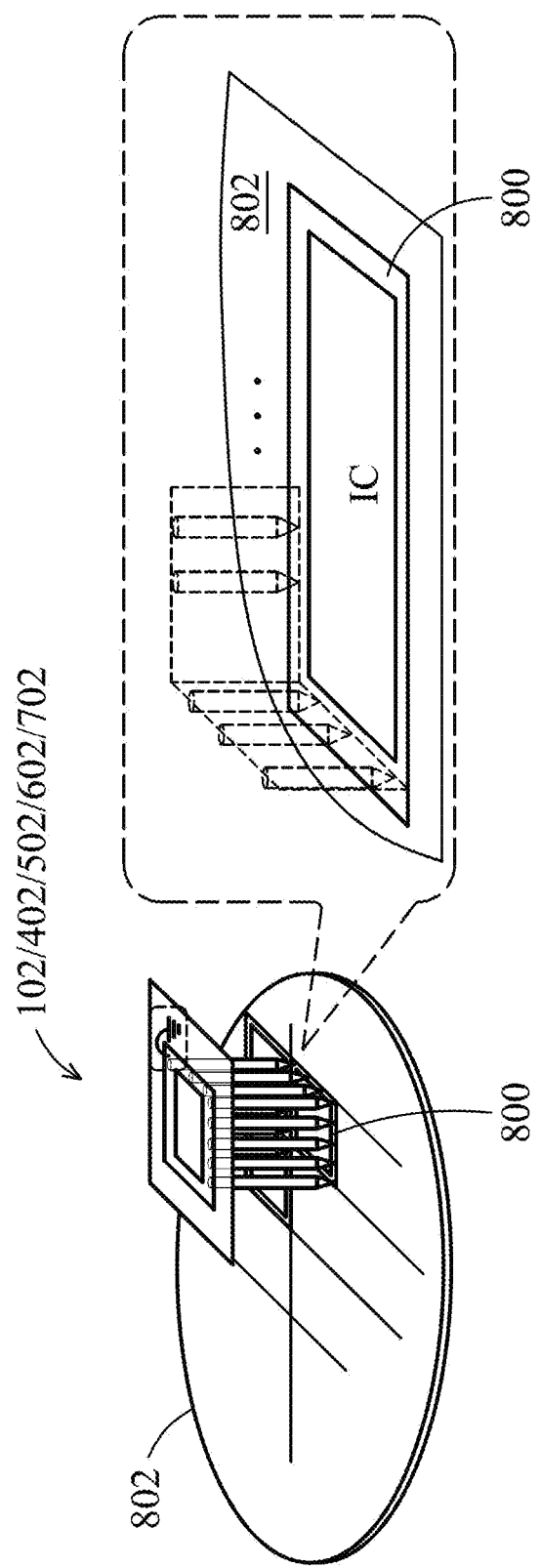
FIG. 8 is a perspective view illustrating the shielding probe of FIG. 1, 4A, 6A, or 7A positioned in contact with a conductive guard ring surrounding an integrated circuit on a wafer in accordance with some embodiments.

FIG. 8 is a perspective view illustrating any of the shielding probes 102, 402, 502, 602 and 702 of FIGS. 1, 4A, 4B, 5, 6A, 6B, 7A, 7B positioned in contact with a conductive guard ring 800 surrounding an integrated circuit IC on a wafer 802 in accordance with embodiments of the present disclosure. In each of these embodiments, conductive guard rings such as the conductive guard rings 800 of FIG. 8, are formed on the wafer 802 surrounding each integrated circuit IC on the wafer. Lower ends of the conductive elements (e.g., conductive elements 106 of FIG. 1) or conductive shield walls (e.g., conductive shield walls 706 of FIGS. 7A, 7B) of the corresponding shielding cage of the shielding probe, contact these guard rings 800 when the shielding probe is in position over an integrated circuit IC being tested, and provide shielding of the integrated circuit and tester probe (not shown in FIG. 8) during such testing as previously described. The formation of the conductive guard rings 800 on the wafer 802 occupies valuable space on the wafer, and thus, for at least this reason, it may not be possible or desirable to form such conductive guard rings on the wafer.

Figure 9:
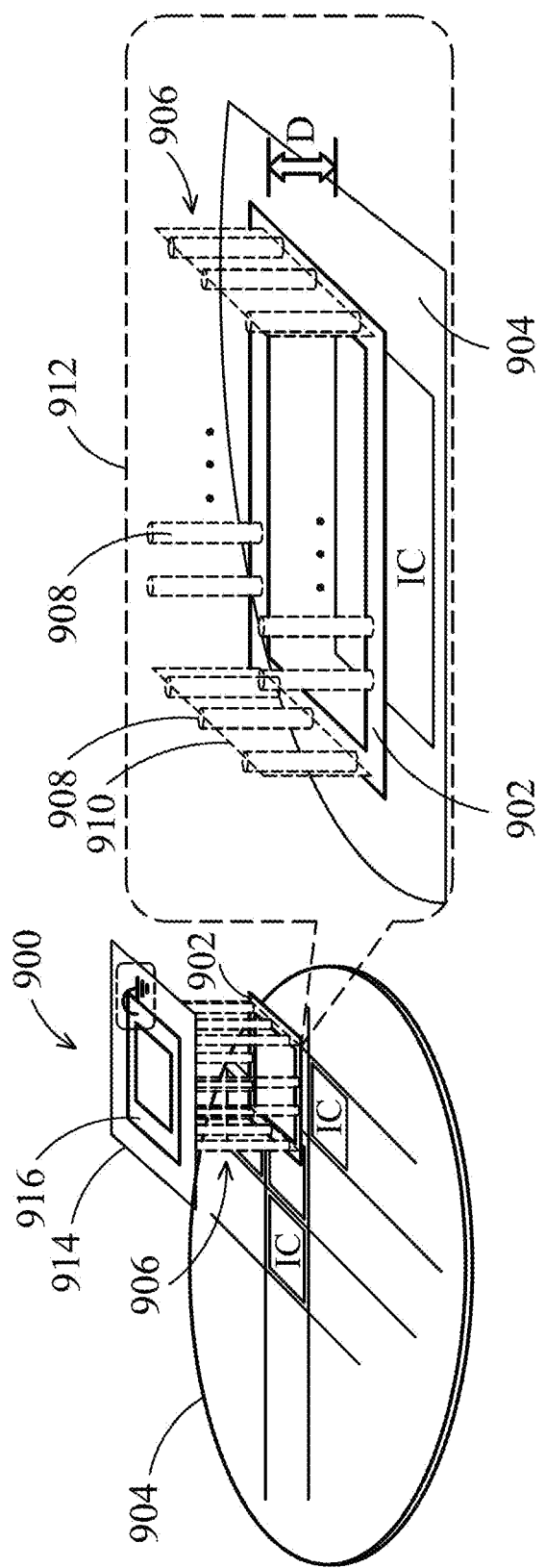
FIG. 9 is a perspective view illustrating a shielding probe including a conductive perimeter ring configured to be positioned over or in contact with a region of a wafer surrounding an integrated circuit on the wafer in accordance with some embodiments.

FIG. 9 is a perspective view illustrating a shielding probe 900 including a conductive perimeter ring 902 configured to be positioned over or in contact with a region of a wafer 904 surrounding an integrated circuit IC on the wafer in accordance with further embodiments of the present disclosure. The shielding probe 900 incudes a shielding cage 906 including conductive elements 908 or conductive shield walls 910, as shown in the magnified partial view of the lower portion shielding probe, in the dashed line 912 in FIG. 9. The shield cage 906 includes either the conductive elements 908 on all four sides of the cage, or on two sides of the cage with conductive shield walls 910 forming the other two walls of the shielding cage. FIG. 9 illustrates this structure by showing, for the left and right sides of the shielding cage 906, both the conductive elements 908 and conductive shield walls 910. Each of the left and right walls of the cage 906 is formed by either conductive elements 908 or a conductive shield wall 910.

In this embodiment, the lower ends of the conductive elements 908 are not pointed as in prior embodiments, but instead are flat and are attached to the conductive perimeter ring 902 as shown in the figure. Lower ends of the conductive shield walls 910 are similarly attached to the conductive perimeter ring 902. The probe 900 also includes a base 914 and conductive probe ring 916, which is grounded in the embodiment of FIG. 9. In operation, during testing of an integrated circuit IC on the wafer 904, the shielding probe 900 may be positioned over the integrated circuit with the conductive perimeter ring 902 in contact with a surface of the wafer around a perimeter of the integrated circuit. Alternatively, the shielding probe 900 may be positioned at a distance D over the integrated circuit IC being tested, as shown in the dashed line 912. In this embodiment, the conductive perimeter ring 902 is at the distance D over the surface of the wafer around the perimeter of the integrated circuit IC being tested. One or more conductive elements 908 may extend beyond the conductive perimeter ring 902 toward the integrated circuit IC and coupling with the integrated circuit IC during test.

Figure 10:
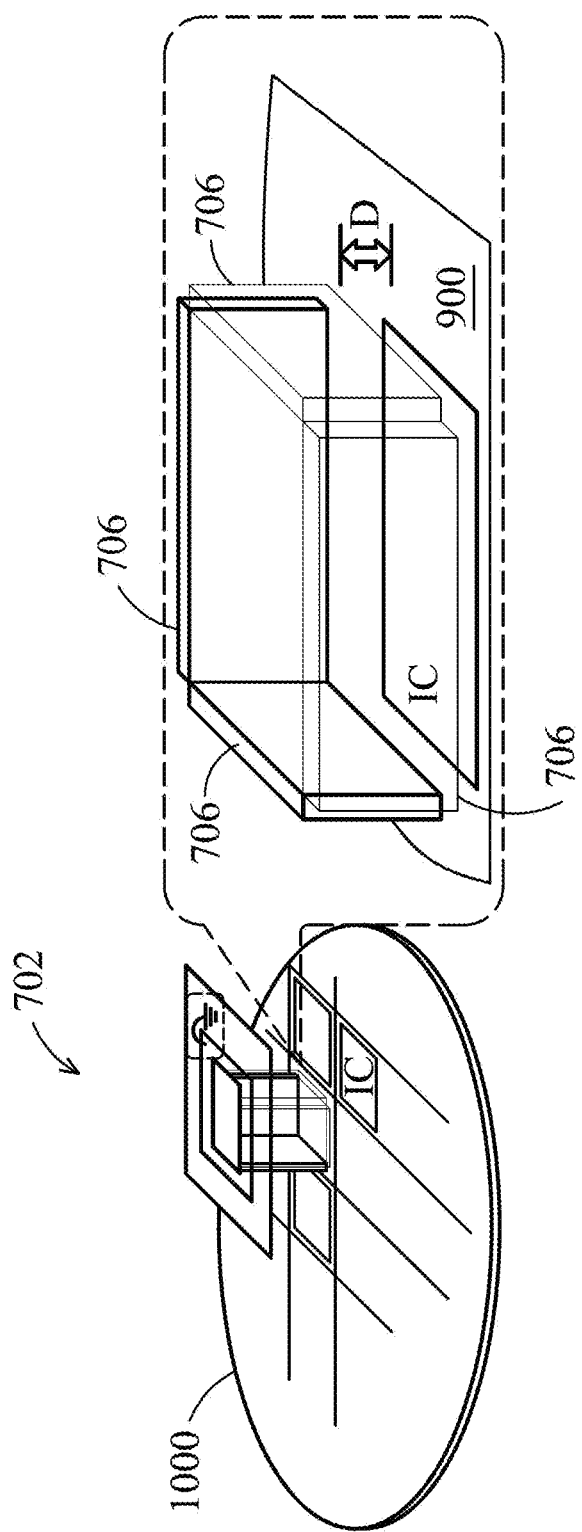
FIG. 10 is a perspective view illustrating the shielding probe of FIG. 7A including four conductive shield walls that are configured to be positioned over and not in contact with the wafer in a region of the wafer surrounding the integrated circuit being tested in accordance with some embodiments.

FIG. 10 is a perspective view illustrating the shielding probe 702 of FIG. 7A positioned over and not in contact with a wafer 1000 in a region of the wafer surrounding an integrated circuit IC being tested in accordance another embodiment. In operation, the shielding probe 702 is positioned with the lower ends of the conductive shield walls 706 positioned at a distance D over a surface of the wafer 1000 and over the integrated circuit IC being tested. The test contacts of a tester probe (not shown) would be in contact with contact pads of the integrated circuit IC when the shielding probe 702 is in this position to thereby test the integrated circuit.

Figure 11:
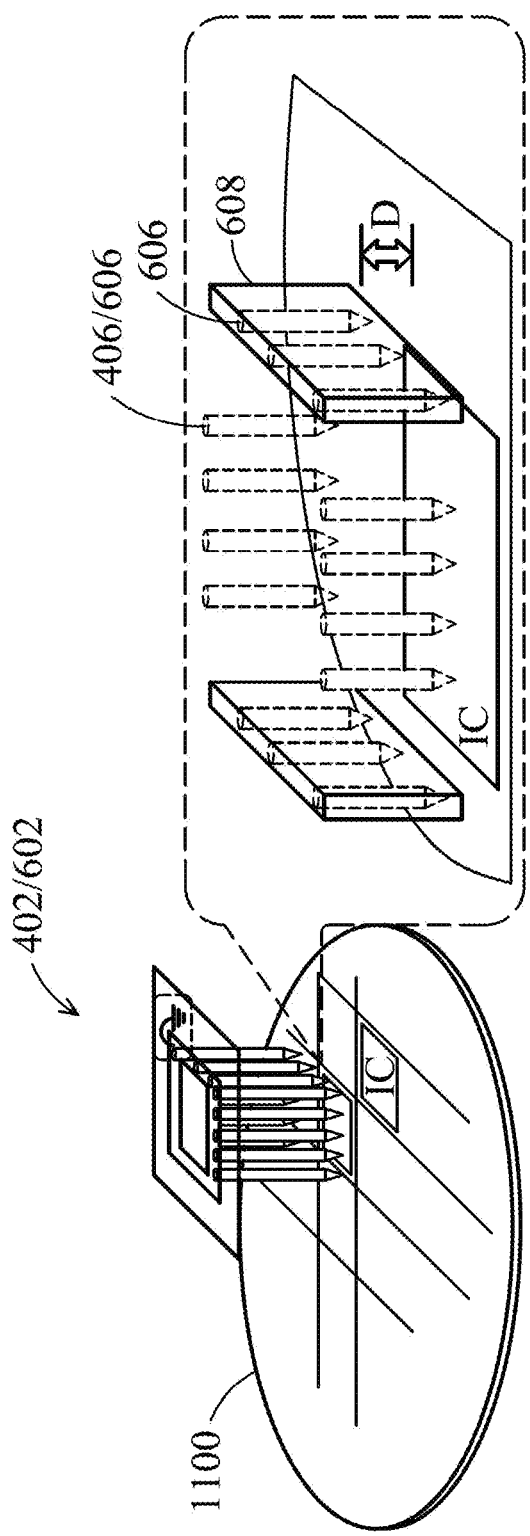
FIG. 11 is a perspective view of the shielding probe of FIG. 4A or 6A configured to be positioned over and not in contact with the wafer in a region of the wafer surrounding the integrated circuit being tested in accordance with some embodiments.

FIG. 11 is a perspective view of the shielding probe 402 of FIG. 4A or shielding probe 602 of FIG. 6A configured to be positioned over and not in contact with a wafer 1100 in a region of the wafer surrounding the integrated circuit IC being tested in accordance with an embodiment of the present disclosure. The wafer 1100 includes no conductive guard rings formed on the wafer surrounding each integrated circuit IC in this embodiment.

Figure 12C:
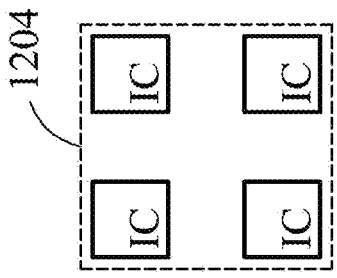
FIGS. 12A-12F are plan views illustrating further embodiments of shielding probes configured to surround a plurality of integrated circuits on a wafer in accordance with some embodiments.
Figure 12F:
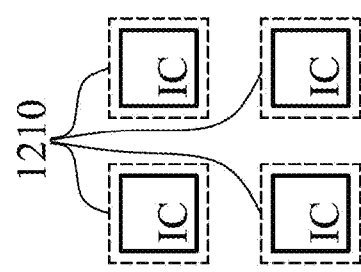
Figure 12B:
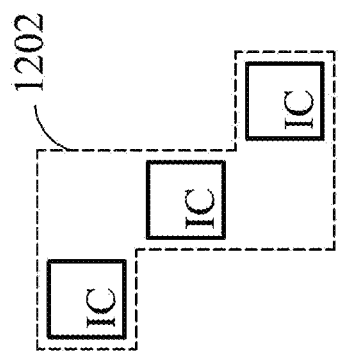
Figure 12E:
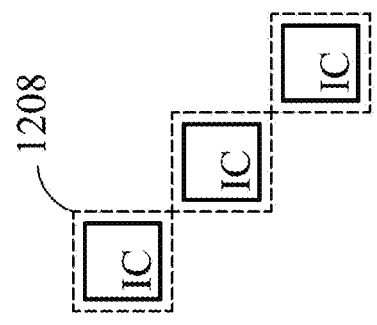
Figure 12A:
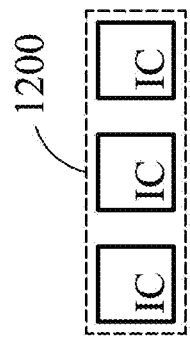
Figure 12D:
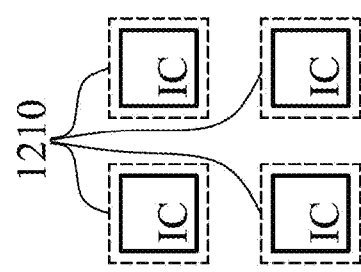

FIGS. 12A-12F are plan views illustrating further embodiments of shielding probes configured to surround a plurality of integrated circuits IC on a wafer in accordance with further embodiments of the present disclosure. FIG. 12A shows a shielding probe 1200, which is represented as a dashed line, configured to surround three adjacent integrated circuits IC contained in a row of such integrated circuits formed on a wafer. A row of integrated circuits IC is considered to be a group of integrated circuits arranged horizontally in FIGS. 12A-12F and a column of integrated circuits is a group of integrated circuits arranged vertically. FIG. 12B shows another embodiment of a shielding probe 1202 configured to surround a group of diagonally adjacent integrated circuits IC in adjacent rows and columns of integrated circuits. FIG. 12C shows a shielding probe 1204 that surrounds four adjacent integrated circuits IC as shown. FIG. 12D shows a shielding probe 1206 that includes a plurality, in this example three, of individual shielding probes, each of which surrounds a respective adjacent integrated IC in a row of integrated circuits. FIG. 12E shows a shielding probe 1208 that individually surrounds a group of diagonally adjacent integrated circuits IC in adjacent rows and columns of integrated circuits on the wafer. Finally, FIG. 12F shows a shielding probe 1210 that individually surrounds four adjacent integrated circuits IC as shown. The embodiments of FIGS. 12A-12F illustrate that shielding probes according to embodiments of the present application are not limited to surrounding a single integrated circuit IC on a wafer, but instead may have different arrangements to surround multiple integrated circuits.

Figure 13B:
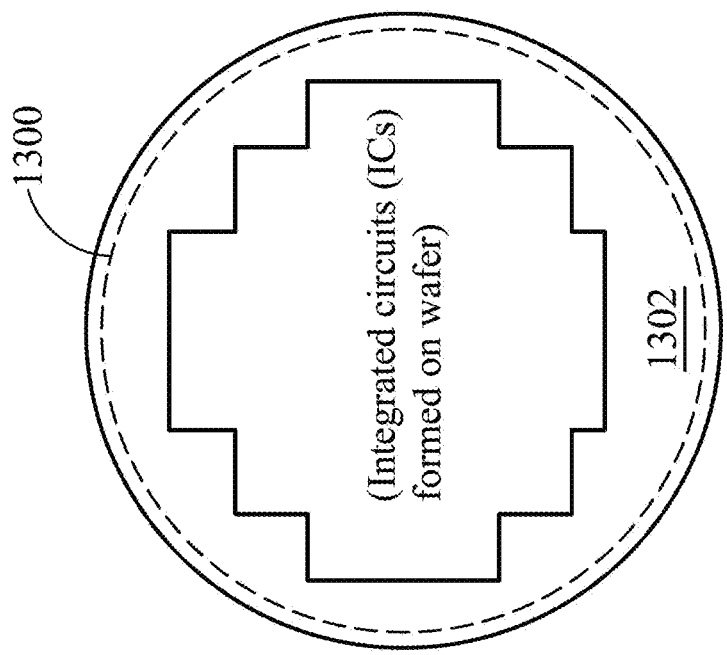
FIG. 13A is an embodiment of a shielding probe configured to surround an edge of the wafer and FIG. 13B is an embodiment of a shielding probe configured to surround an outer periphery of a mask boundary of the wafer in accordance with some embodiments.
Figure 13A:
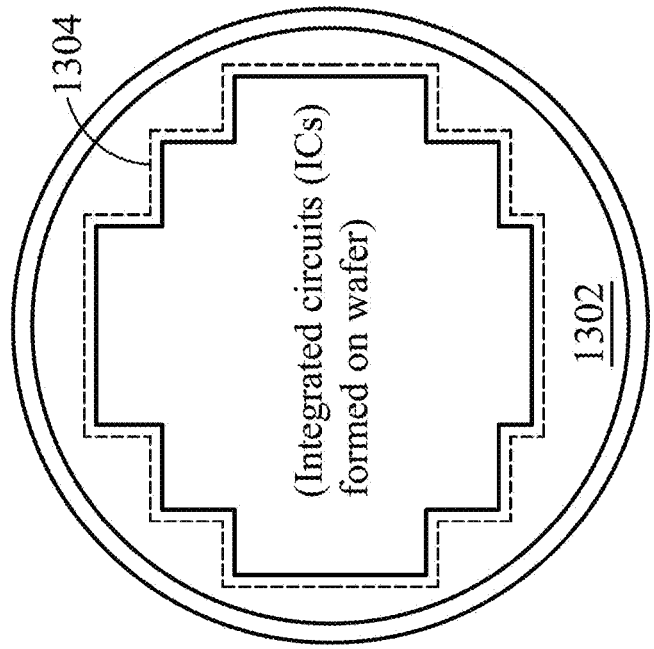

FIG. 13A is an embodiment of a shielding probe 1300 configured to surround an edge of a wafer 1302 and FIG. 13B is an embodiment of a shielding probe 1304 configured to surround an outer periphery of a mask boundary of the wafer in accordance with further embodiments of the present disclosure. Thus, in FIG. 13A the shielding probe 1300 surrounds the edge of the wafer 1302 during testing of all integrated circuits ICs formed in the wafer. All the integrated circuits ICs formed on the wafer 1302 have a "mask boundary," which corresponds to an outer perimeter of the group of all integrated circuits formed in the wafer. The shielding probe 1304 is configured to surround this mask boundary during testing of the integrated circuits.

Figure 14B:
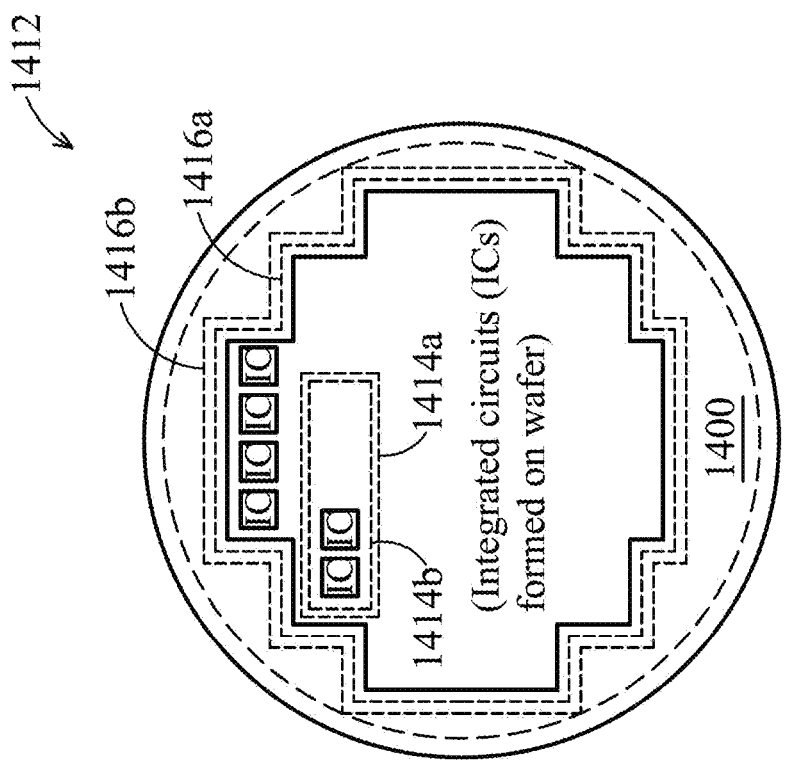
FIGS. 14A and 14B illustrate shielding probes including multi-level shielding in accordance with some embodiments.
Figure 14A:
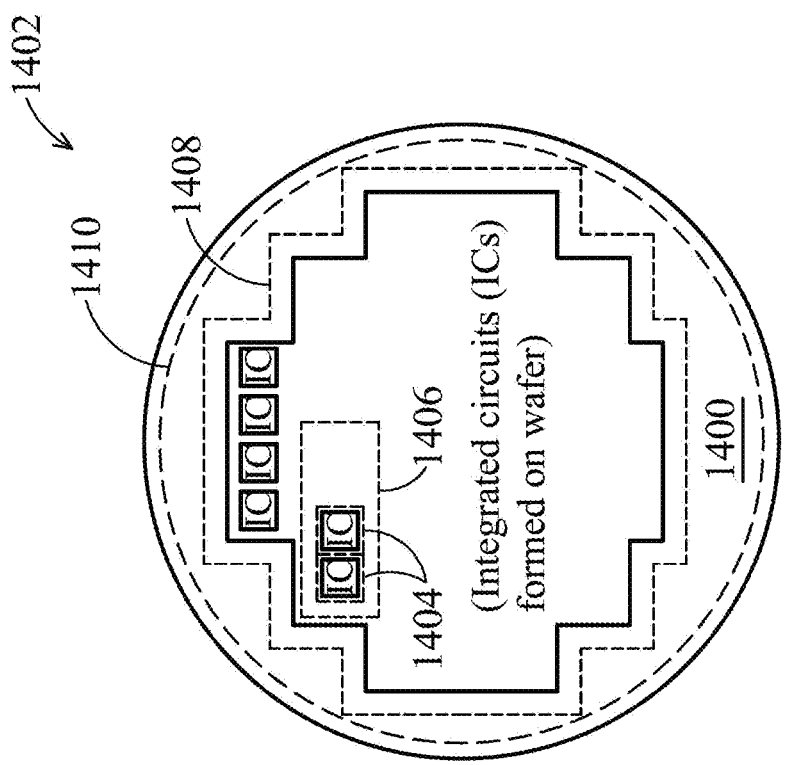

FIGS. 14A and 14B illustrate shielding probes including multi-level shielding in accordance with further embodiments of the present disclosure. FIG. 14A shows a plurality of integrated circuits ICs formed in a wafer 1400. In this embodiment, a shielding probe 1402 includes several levels of shielding probes. More specifically, the shielding probe 1402 includes individual-level shielding probes 1404, each of which surrounds an individual integrated circuit IC. The shielding probe 1402 also includes a group-level shielding probe 1406 that surrounds a group of individual integrated circuits IC. A mask boundary level shielding probe 1408 surrounds of the mask boundary of all the integrated circuits ICs formed on the wafer 1400 and a wafer-level shielding probe 1410 is along an edge or periphery of the wafer to surround the entire wafer. FIG. 14B shows a shielding probe 1412 including duplicate levels of multi-level shielding. The shielding probe 1412 includes dual group-level shielding probes 1414a, 1414b and duplicate mask boundary shielding probes 1416a, 1416b.

Figure 15:
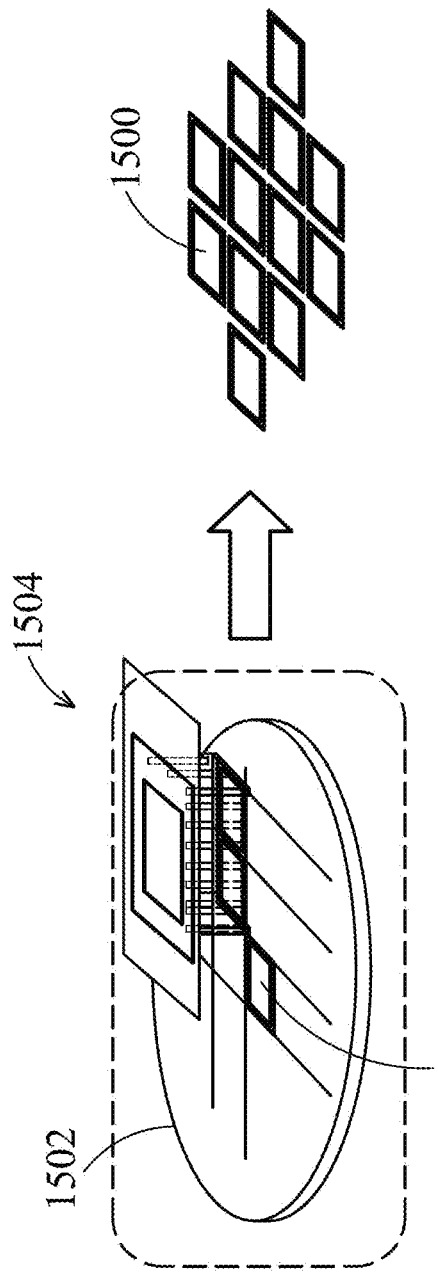
FIG. 15 illustrates the shielding probes of FIGS. 1-14B applied to circuit probe (CP) testing and wafer level chip scale packaging (WLCSP) testing in accordance with some embodiments.

FIG. 15 illustrates the shielding probes according to any of the embodiments of FIGS. 1-14B applied to circuit probe (CP) testing and wafer level chip scale packaging (WLCSP) testing in accordance with embodiments of the present disclosure. In FIG. 15, WLCSP devices 1500 are formed on a wafer 1502 and a shielding probe 1504 is used in testing these WLCSP devices, where the shielding probe 1504 may be any of the embodiments of shielding probes described in FIGS. 1-14B.

Figure 16:
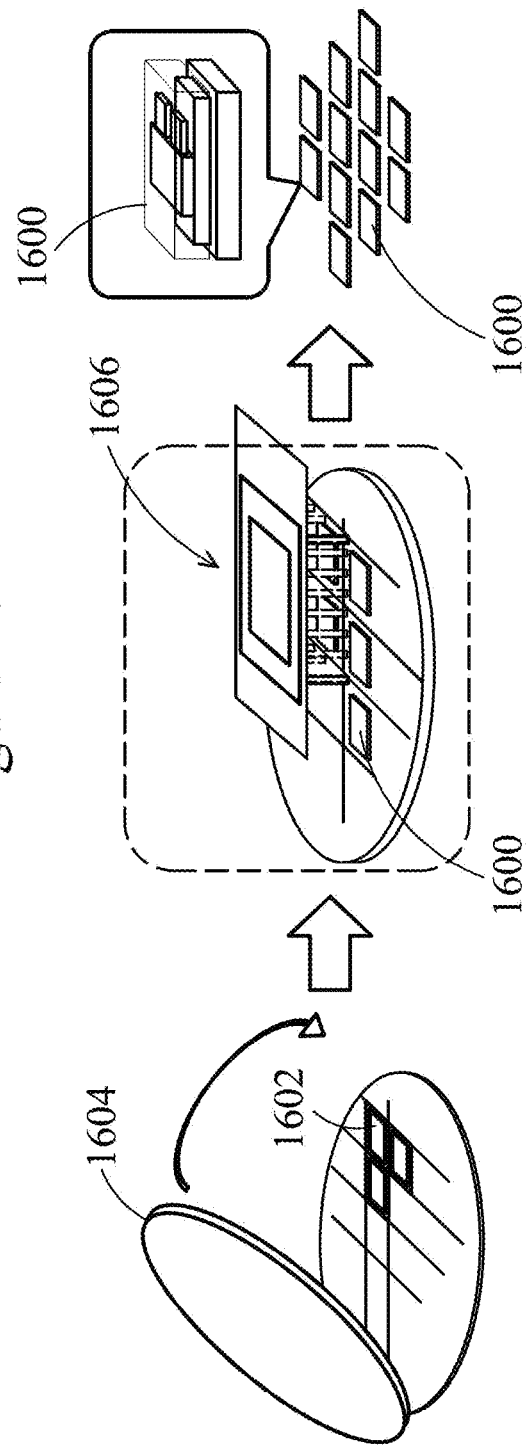
FIG. 16 illustrates the shielding probes of FIGS. 1-14B applied to chip-on-wafer-on-substrate (COWOS) testing in accordance with some embodiments.

FIG. 16 illustrates that the shielding probes of FIGS. 1-14B may also be used in testing multiple chip-on-wafer-on-substrate (COWOS) device 1600 in further embodiments of the present disclosure. COWOS device 1600 utilizes a wafer-level multi-chip packaging technology that incorporates multiple chips 1602 side-by-side on a silicon interposer 1604 to achieve better interconnect density and performance. The chips are bonded through micro-bumps on the silicon interposer forming a chip-on-wafer (COW). A package frame is added to each chip-on wafer to form the COWOS device 1600. The silicon interposer 1604 provides external connection sites using through substrate vias (TSV). These external connection sites may be used to couple the shielding probe 1606 to one or more COWOS devices 1600 prior to singulation into separate COWOS devices 1600.

Figures 17A, 17B, 17C:
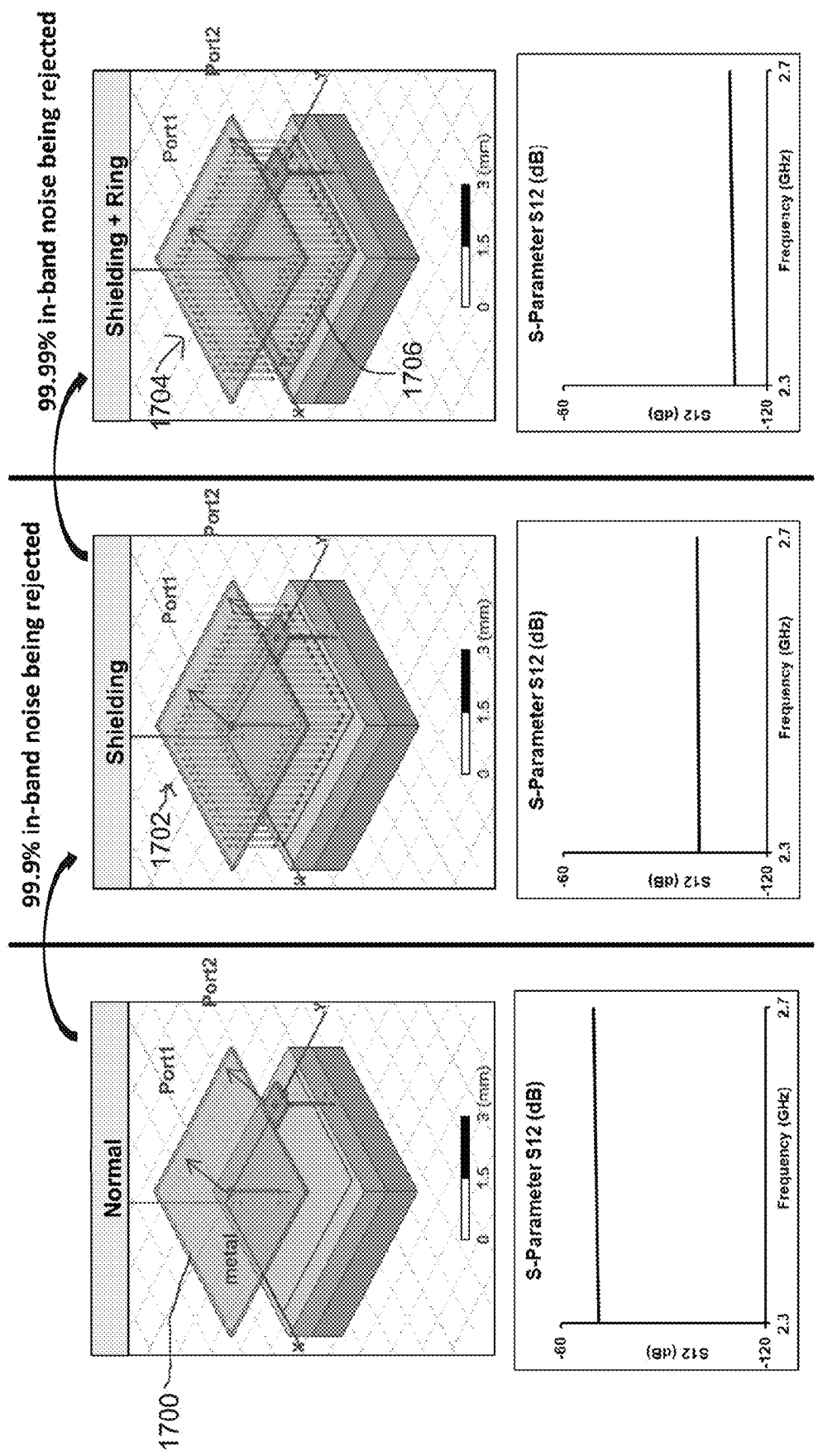
FIGS. 17A-17C illustrate electromagnetic simulation results for conventional circuit probe testing, for a shielding probe according to some embodiments, and for a shielding probe and conductive guard ring in accordance with some embodiments.

FIGS. 17A-17C illustrate electromagnetic simulation results for conventional circuit probe testing, for a shielding probe according to some embodiments of the present disclosure, and for a shielding probe and conductive guard ring in accordance with some embodiments. FIG. 17A shows a conventional circuit probe without any shielding except for metal plate 1700 at the top of the circuit probe and the corresponding graph shows simulation results over the corresponding frequency range. FIG. 17B shows a shielding probe 1702 according to embodiments of the present disclosure and the simulation results in the corresponding graph. The shielding probe 1702 includes no conductive guard ring on the wafer. FIG. 17C shows a shielding probe 1704 including a guard ring 1706 on the wafer and the corresponding simulation results shown in the graph. The shielding probe 1702 provides significant attenuation (−100 dB) of electromagnetic signals in 2.3-2.7 GHz frequency range compared to conventional circuit probe of FIG. 17A (−70 dB), and the shielding probe 1704 with the guard ring 1706 provides still further attenuation (−110 dB).

Figure 18:
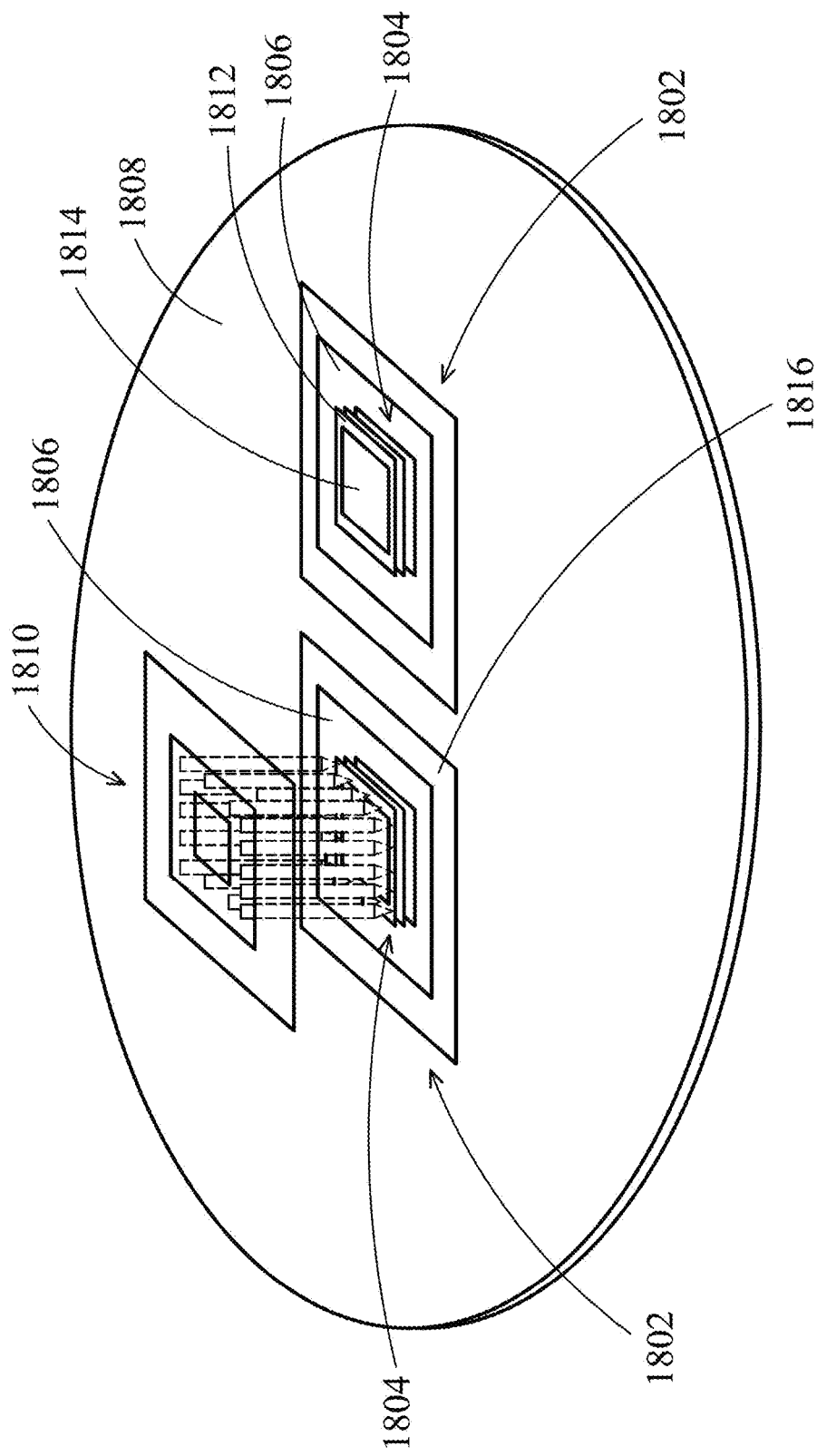
FIG. 18 illustrates the shielding probes of FIGS. 1-14B applied to 3 dimension integrated circuit (3DIC) testing in accordance with some embodiments.

The shielding probes of FIGS. 1-14B may also be used in testing three dimensional integrated circuits (3DIC) as shown in FIG. 18 in which two 3DIC 1802 are shown for clarity. The 3DIC 1802 includes multiple-integrated circuits 1804 which have been stacked and bonded to each other using a base die 1806 on silicon wafer 1808. Probe testing may occur as die are stacked on top of each other. Shielding probe 1810 is shown coupling to a conductive probe ring 1812 on a top die 1814 of the 3DIC 1802. Alternately, the shielding probe may be sized to couple to a conductive probe ring 1816 around the base die 1806 on silicon wafer 1806 (coupling to shielding probe not shown).

Figure 19:
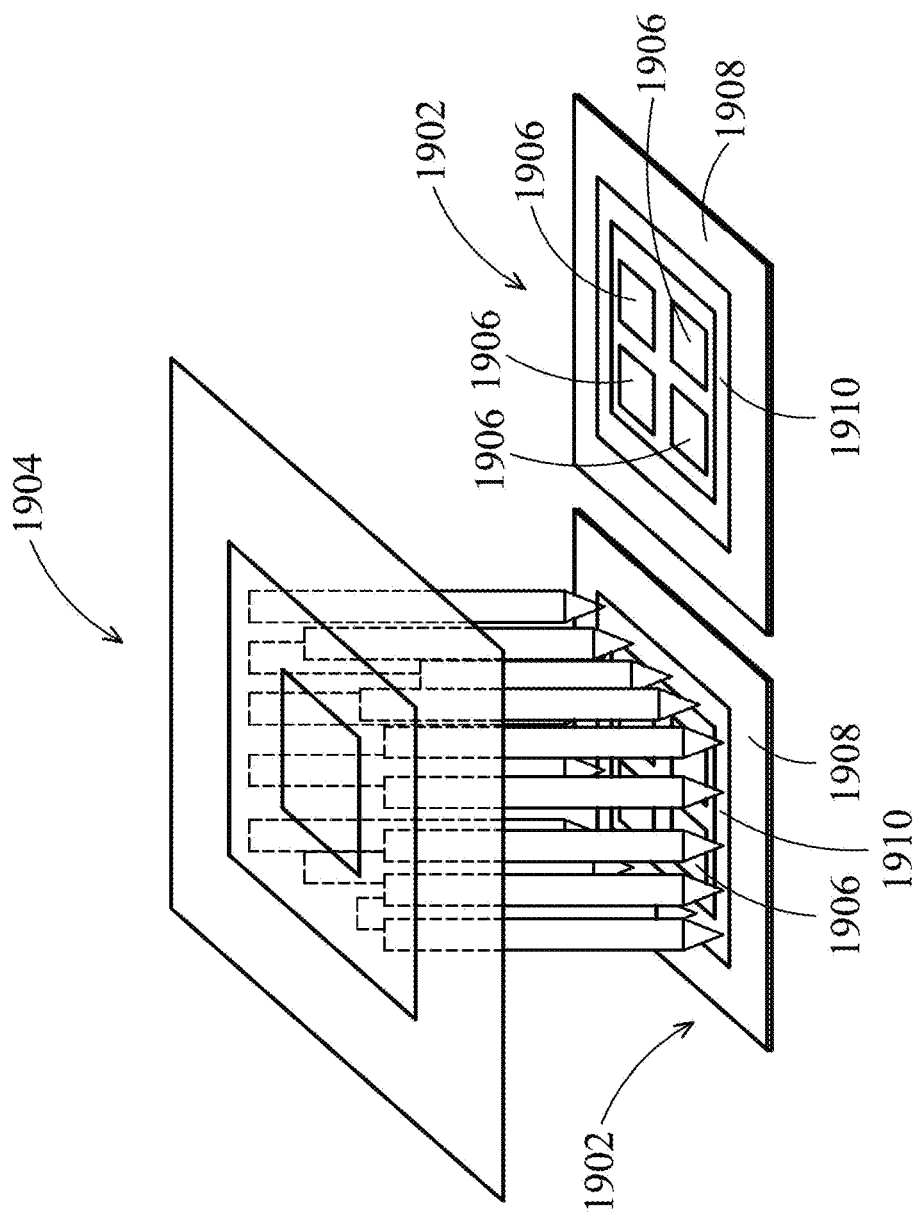
FIG. 19 illustrates the shielding probes of FIGS. 1-14B applied to integrated fanout (INFO) testing in accordance with some embodiments.

The shielding probes of FIGS. 1-14B may also be used in testing integrated circuits packaged using integrated fanout (INFO) technology. Referring to FIG. 19, two INFO packages 1902 are shown, one INFO package 1902 coupled to a shielding probe 1904 and a second INFO package 1902 shown for clarity. Integrated circuit chips 1906 are coupled to a printed circuit board 1908. Conductive probe ring 1910 on printed circuit board 1908 is used to couple to shielding probe 1904.

In embodiments of the present disclosure, a circuit probe includes a shielding probe that provides electromagnetic shielding for integrated circuits on a wafer that are being tested. This enables more reliable testing of the integrated circuits.

In one embodiment, a circuit probe includes a shielding probe having a base and a conductive probe ring on the base. A shielding cage is attached to the conductive probe ring and has an interior. The shielding cage is configured to be positioned to contain in the interior of the shielding cage at least one integrated circuit formed on a wafer, and to provide electromagnetic shielding of the at least one integrated circuit during testing of the at least one integrated circuit.

In another embodiment, a circuit probe includes a shielding probe having a plurality of spaced apart conductive elements. The shielding probe has an interior defined by the plurality of spaced apart conductive elements and the plurality of spaced apart conductive elements are configured to form a plurality of waveguides that provide electromagnetic shielding of electromagnetic waves external to the shielding probe. A tester probe is positioned in the interior of the shielding probe.

A further embodiment is a method of testing an integrated circuit on a wafer. The method includes positioning a shielding cage over the integrated circuit. The shielding cage has an interior. The method then includes applying, through test contacts of a tester probe in the interior of the shielding cage, electrical test signals to and receiving electrical test signals from the integrated circuit to thereby test the integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A circuit probe, comprising:
a shielding probe including:
  a base;
  a conductive probe ring on the base; and
  a shielding cage attached to the conductive probe ring and having an interior, the shielding cage configured to be positioned to contain in the interior of the shielding cage at least one integrated circuit formed on a wafer and to provide electromagnetic shielding of the at least one integrated circuit during testing of the at least one integrated circuit, wherein the shielding cage comprises a plurality of conductive elements, each conductive element having a first end and a second end opposite the first end, the first ends of the plurality of conductive elements spaced part and connected to the conductive probe ring.

2. The circuit probe of claim 1, where each of the plurality of conductive elements has a non-circular cross-section.

3. The circuit probe of claim 2, wherein each second end of the plurality of the conductive elements is pointed.

4. The circuit probe of claim 1, wherein the shielding cage comprises a plurality of conductive shield walls, each conductive shield wall having a first side attached to the conductive probe ring and a second side opposite the first side.

5. The circuit probe of claim 4, wherein the shielding cage comprises four conductive shield walls.

6. The circuit probe of claim 1, wherein the shielding cage comprises:
a conductive perimeter ring; and
a plurality of conductive elements extending between the conductive perimeter ring and the conductive probe ring.

7. The circuit probe of claim 6, wherein each of the plurality of conductive elements has a circular cross-section.

8. The circuit probe of claim 6, further comprising:
a first conductive shield wall extending between the conductive perimeter ring and the conductive probe ring; and
a second conductive shield wall extending between the conductive perimeter ring and the conductive probe ring.

9. The circuit probe of claim 1, wherein the conductive probe ring is coupled to a ground voltage reference node configured to receive a ground reference voltage.

10. The circuit probe of claim 1, further comprising a tester probe positioned in the interior of the shielding probe.

11. A circuit probe, comprising:
a shielding probe including:
  a base;
  a conductive probe ring on the base; and
  a plurality of spaced apart conductive elements each coupled to the conductive probe ring, the shielding probe having an interior defined in part by the plurality of spaced apart conductive elements and the plurality of spaced apart conductive elements configured to form a plurality of waveguides that provide electromagnetic shielding of electromagnetic waves external to the shielding probe, wherein each conductive element has a first end and a second end opposite the first end, the first ends of the plurality of conductive elements spaced part and connected to the conductive probe ring; and
a tester probe in the interior of the shielding probe.

12. The circuit probe of claim 11, wherein each of the plurality of spaced apart conductive elements comprises a cylinder-shaped rod.

13. The circuit probe of claim 11, wherein each of the plurality of spaced apart conductive elements has a width, and the plurality of spaced apart conductive elements are spaced apart a height, the width and height having values to form a rectangular waveguide having a desired cutoff frequency.

14. The circuit probe of claim 11, wherein the shielding probe further comprises a plurality of conductive shield walls.

15. A method of testing an integrated circuit on a wafer, the method comprising:
positioning a shielding cage over the integrated circuit, the shielding cage being coupled to a conductive probe ring on a base of a shielding probe and having an interior, wherein the shielding cage comprises four conductive shield walls each corresponding to a rectangular conductive sheet, each shield wall having an end coupled to the conductive probe ring, the conductive shield walls collectively laterally enclosing the interior; and
applying, through test contacts of a tester probe in the interior of the shielding cage, electrical test signals to and receiving electrical test signals from the integrated circuit to thereby test the integrated circuit.

16. The method of testing an integrated circuit on a wafer of claim 15, wherein positioning the shielding cage comprises positioning the shielding cage to contact a surface of the wafer surrounding the integrated circuit.

17. The method of testing an integrated circuit on a wafer of claim 15, wherein positioning the shielding cage comprises positioning the shielding cage at a distance over and not in contact with a surface of the wafer surrounding the integrated circuit.

18. The method of testing an integrated circuit on a wafer of claim 15, wherein the wafer includes a plurality of integrated circuits, and wherein positioning the shielding cage further comprises positioning the shielding cage around the plurality of integrated circuits.

19. The method of testing an integrated circuit on a wafer of claim 15, wherein the wafer includes an edge and wherein positioning the shielding cage further comprises positioning the shielding cage around the edge of the wafer.

20. The method of claim 15, comprising applying ground voltage to the conductive probe.

* * * * *